US008505691B2

(12) United States Patent
Smeeton et al.

(10) Patent No.: US 8,505,691 B2
(45) Date of Patent: Aug. 13, 2013

(54) FORKLIFT SHIPPING AND HANDLING APPARATUS

(75) Inventors: Robert J. Smeeton, Central Square, NY (US); Peter G. Csigi, Liverpool, NY (US)

(73) Assignee: Belle Technologies, LLC, Liverpool, NY (US)

( * ) Notice: Subject to any disclaimer, the term of this patent is extended or adjusted under 35 U.S.C. 154(b) by 491 days.

(21) Appl. No.: 11/950,136

(22) Filed: Dec. 4, 2007

(65) Prior Publication Data

US 2009/0139803 A1 Jun. 4, 2009

(51) Int. Cl.

| | |
|---|---|
| ***B66F 9/06*** | (2006.01) |
| ***B66F 9/10*** | (2006.01) |
| ***H01L 21/677*** | (2006.01) |
| ***B65H 3/08*** | (2006.01) |

(52) U.S. Cl.
USPC ........... 187/222; 187/226; 187/414; 414/629; 414/631; 414/797; 414/800

(58) Field of Classification Search
USPC ................. 187/222, 226, 414; 414/629, 631, 414/608, 540, 541, 542, 544, 800, 797; 280/47.16, 47.2, 47.24, 47.27, 103; 224/546, 224/547, 557; 16/19, 45, 47, 30, 29; 180/19.1, 180/19.2, 19.3, 23, 24, 211, 253
IPC .. B66F 9/06, 9/08, 9/12, 9/18, 9/10; B65H 3/08
See application file for complete search history.

(56) References Cited

U.S. PATENT DOCUMENTS

| | | | | | |
|---|---|---|---|---|---|
| 1,591,719 | A | * | 7/1926 | Merrifield | 187/241 |
| 2,277,302 | A | * | 3/1942 | Chenette | 280/659 |
| 2,361,592 | A | * | 10/1944 | Bjork | 114/344 |
| 2,417,553 | A | * | 3/1947 | Jensen | 280/47.12 |
| 2,421,123 | A | * | 5/1947 | Jensen | 280/47.12 |
| 3,052,323 | A | * | 9/1962 | Hopfeld | 187/232 |
| 3,179,196 | A | * | 4/1965 | Richardson | 180/14.1 |
| 3,385,401 | A | * | 5/1968 | Campbell et al. | 187/222 |
| 3,411,798 | A | * | 11/1968 | Capadalis | 280/5.32 |
| 3,512,663 | A | * | 5/1970 | Guerrico | 414/373 |
| 3,780,831 | A | * | 12/1973 | Dickenson | 187/223 |
| 3,809,261 | A | * | 5/1974 | Lee | 414/373 |
| 3,873,118 | A | * | 3/1975 | Takagi | 280/47.2 |
| 3,896,904 | A | * | 7/1975 | Walker | 187/231 |
| 4,221,535 | A | | 9/1980 | Quinn | |
| 4,458,785 | A | * | 7/1984 | Bushnell, Jr. | 187/231 |
| 5,161,933 | A | * | 11/1992 | Stauber | 414/608 |
| 5,236,299 | A | * | 8/1993 | Oskam | 414/608 |

(Continued)

FOREIGN PATENT DOCUMENTS

JP 09-286271 A 11/1997

*Primary Examiner* — William A Rivera
*Assistant Examiner* — Stefan Kruer
(74) *Attorney, Agent, or Firm* — Burgess Law Office, PLLC

(57) ABSTRACT

A shipping and handling system for a fork lift truck that has a cab and rails extending vertically above the cab. A first bracket is secured to the back of the rails and a second bracket is secured to the back of the cab. One bracket is provided with wheel while the other is provided with legs so that the truck is able to rest on the brackets when it is tipped over upon its back. A special adaptor is provided that allows a second fork lift truck to hitch onto the unwheeled bracket and lift the bracket off the support surface whereupon the first truck can be easily maneuvered from place to place.

18 Claims, 6 Drawing Sheets

(56) References Cited

U.S. PATENT DOCUMENTS

| | | | | | |
|---|---|---|---|---|---|
| 5,692,872 | A | * | 12/1997 | Raben | 414/607 |
| 5,813,820 | A | | 9/1998 | Dubosh et al. | |
| 5,829,947 | A | * | 11/1998 | Litten | 414/537 |
| 5,967,734 | A | * | 10/1999 | Liu | 414/490 |
| 6,062,800 | A | | 5/2000 | Perry et al. | |
| 7,290,782 | B2 | * | 11/2007 | Brown | 280/476.1 |
| 2007/0247327 | A1 | * | 10/2007 | Hammerl | 340/825.69 |
| 2008/0230286 | A1 | * | 9/2008 | Turner | 180/19.2 |
| 2009/0142174 | A1 | * | 6/2009 | Fischer et al. | 414/636 |

* cited by examiner

FORKLIFT SHIPPING AND HANDLING APPARATUS

CROSS-REFERENCE TO RELATED APPLICATIONS

FIELD OF THE INVENTION

The invention relates generally to fork lift trucks and, in particular, to a system for easier and safer shipping handling of this type of equipment.

BACKGROUND OF THE INVENTION

While fork lift trucks have been designed to carry out various tasks, these trucks all have the same general configuration, that includes a cab for the operator and vertically extended rails upon which the lifting forks ride. In larger units, particularly those used in warehouses or the like, the height of the rails typically exceeds the length of the cab and as a consequence, the units become difficult to handle where they are required to be shipped from one location, such as the manufacturer's facility, to the end users' place of business. Generally these units are tipped over onto their backs and are crated in heavy wooden frames for shipment. Although the overall shipping package has a relatively low profile, the crate itself can increase the overall weight of the unit being shipped and does little to improve the ease of handling of the package. In addition, once the package is opened at the shipping destination, the wood is generally discarded which is not only wasteful but also environmentally unfriendly because of the number of trees that are sacrificed in carrying out this wasteful practice.

Large storage facilities will typically employ a large number of self-propelled fork lift trucks. When not in use the trucks are usually parked in a side by side alignment facing a blank wall or the like. Failure of one or more of the trucks in the alignment to start can cause a problem because of the difficulties involved in handling the disabled vehicle in order to get it to a place where the necessary maintenance can be performed. Similar problems can also be encountered in situations where a truck breaks down in a tight spot within a plant facility that leaves little room for maneuvering. As will be explained in greater detail below, the systems of the present invention may be employed to facilitate shipping of fork lift units and also to handling units that have broken down within a plant.

SUMMARY OF THE INVENTION

It is a primary object of the present invention to provide a system that can easily handle a fork lift vehicle during shipping or in the event the vehicle becomes disabled in a work facility.

It is a farther object of the invention to reduce the amount of wood that is presently being used in the creating of fork lift trucks for shipping purposes.

Another object of the present invention is to reduce the costs involved in the packaging of fork lift trucks for shipping.

Yet another object of the present invention is to provide a more environmentally friendly means for packaging fork lift trucks for shipping.

These and other objects of the present invention are attained by means of a shipping and handling system for fork lift trucks that contain a cab and lifting rails that extend upwardly above the top of the cab. The system includes a first bracket that is secured to the lifting rails at some point above the top of the cab and a second bracket that is secured at the back of the cab so that the truck can be turned over to rest upon the brackets. One of the brackets is equipped with wheels while the other is equipped with a pair of support legs upon which the entire weight of the truck rests when it is inverted. A special adaptor that can be mounted upon a dolly is also provided which is able to engage the unwheeled bracket and lift the truck off of the supporting surface whereupon the truck can be easily maneuvered.

BRIEF DESCRIPTION OF THE DRAWINGS

For a better understanding of these and other objects of the invention reference shall be made to the following detailed description of the invention which is to be read in association with the following drawings, wherein.

Corresponding reference characters indicate corresponding parts throughout the several views. The example(s) set out herein illustrates one embodiment of the invention but should not be construed as limiting the scope of the invention in any manner.

DETAILED DESCRIPTION

Figure 1:
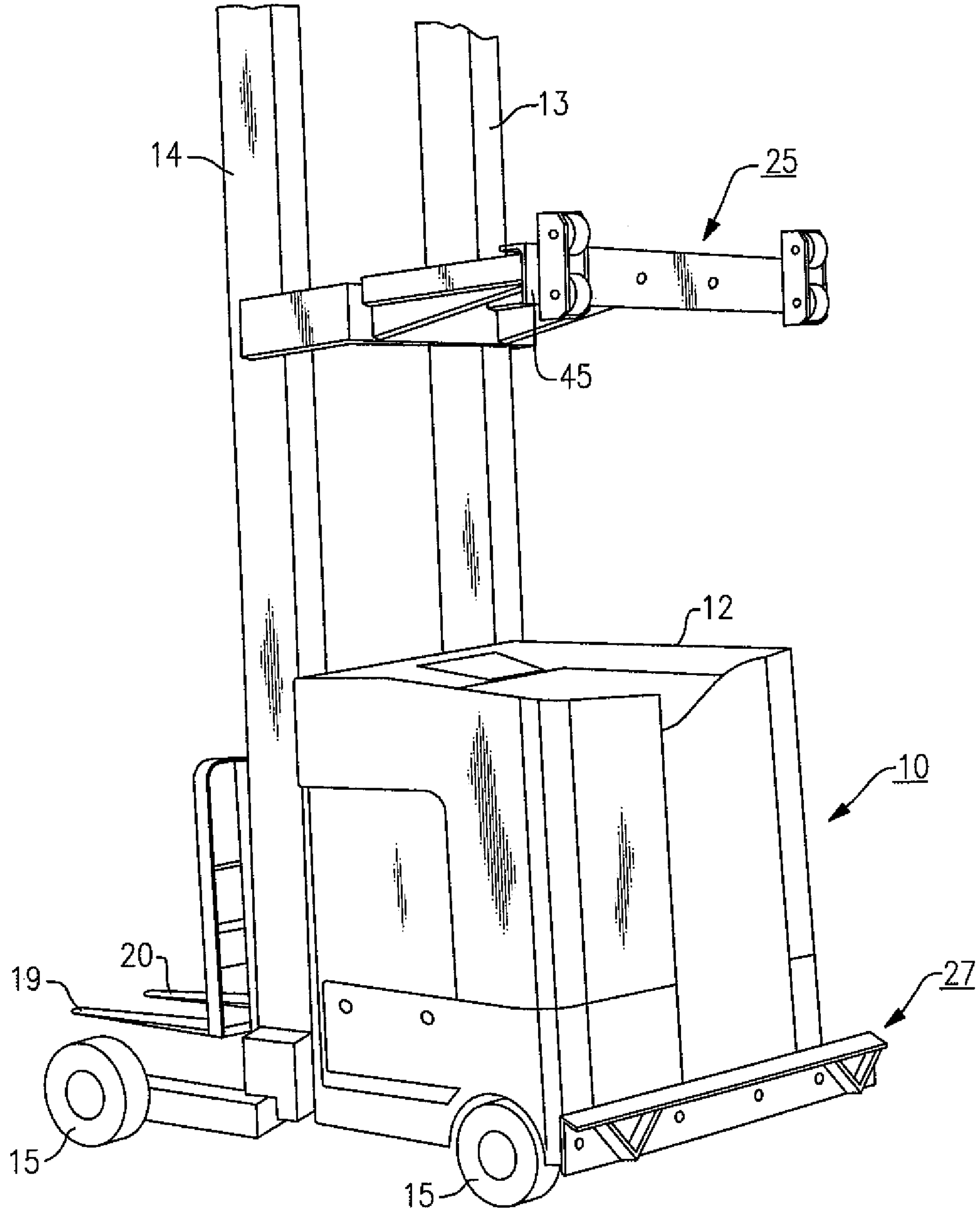
FIG. 1 is a perspective view of a fork lift truck that is equipped with a dolly shipping and handling system embodying the present invention with the truck shown in an upright position.

Referring initially to FIG. 1, there is illustrated a fork lift truck, generally references 10, that embodies the teachings of the present invention. The truck contains a cab 12 in which the operator (not shown) stand upright while maneuvering the vehicle. The truck further contains a pair of parallel lifting arms 13 and 14 that are located in the front section of the vehicle and which extend upwardly from the frame of the vehicle to a height that is well over the top of the cab. The truck frame is mounted upon four wheels 15-15 and is motorized so that it is free to move about the work place without restraint. The motor may be either gas driven or electric. A lift carriage is supported upon the lift rails and is coupled to the motor by a power takeoff whereby the carriage can move vertically upon the rails as well as being canted at an angle with regard to the rail. A pair of L-shaped forks 19 and 20 are adjustably secure to the carriage by well known means so that the spacing between the fork can be regulated with respect to the load that is being handled. In operation, the two forks can be brought into a contiguous relationship at the center of the carriage or spread out to the opposing edges of the carriage.

Although the present invention shall be described with specific relation to the motorized truck illustrated in FIG. 1, it should be clear to one skilled in the art that the invention is not limited for use in this particular embodiment and may find application in association with any type of fork lift whether wheel mounted, track mounted or stationary without departing from the teachings of the invention. The term truck therefore will be used herein to include all three of the above noted embodiments.

Figure 2:
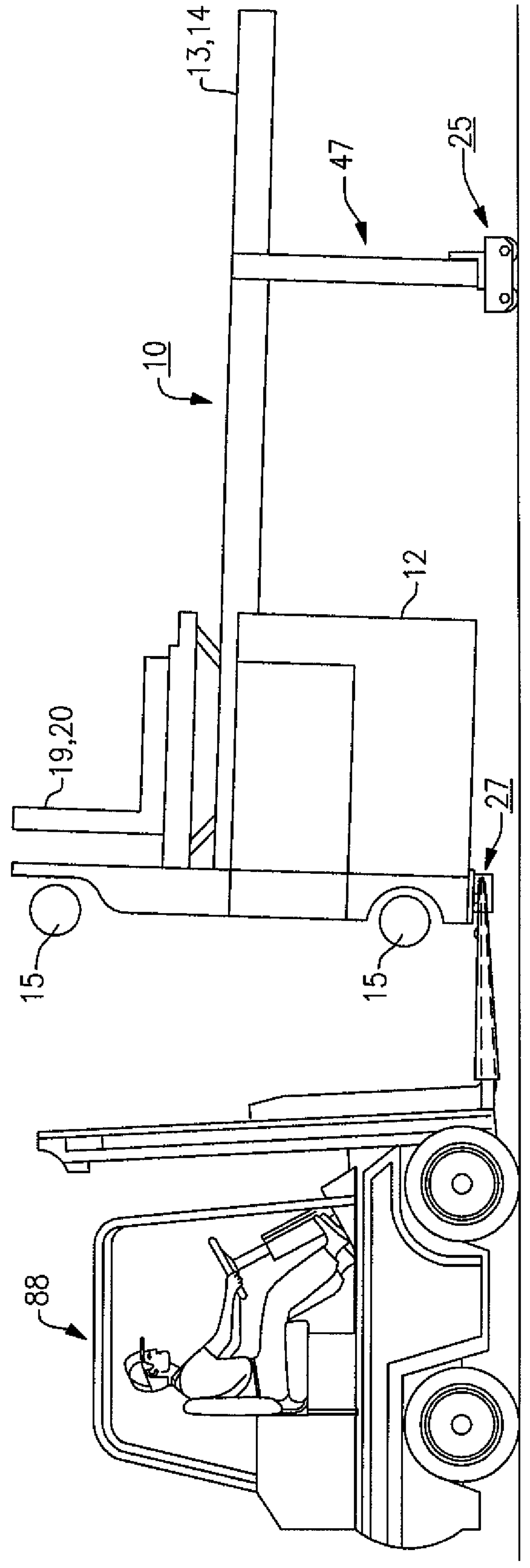
FIG. 2 is a side elevation showing the fork lift truck tipped upon its back with a dolly coupled to the truck by a special adaptor.
Figure 3:
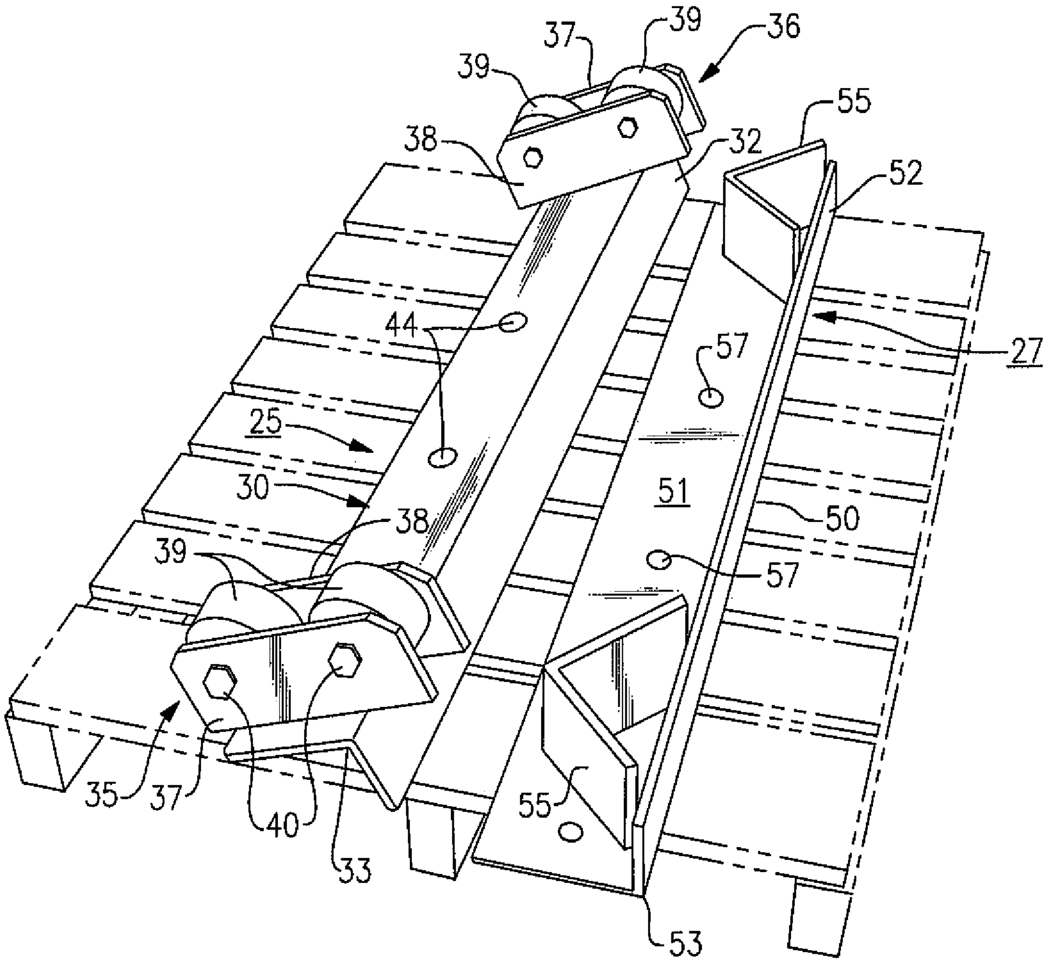
FIG. 3 is a further perspective view showing the wheeled bracket and an un-wheeled bracket of the present system.

As noted above, most fork lift devices of any appreciable rail height are shipped or moved any distance while lying back with the rail in a prone position as illustrated in FIGS. 2. The present invention involves a system having but a few component parts that can be simply and conveniently attached to most any type of fork lift unit to facilitate the handling and shipping of this type of unit without the need of large difficult to handle wooden frames, which consume a great deal of wood. The parts of the system include what will herein be referred to as a front bracket 25 and a rear bracket 27. The two brackets are illustrated in FIG. 3, removed from the unit and shown lying upon a pallet 28 for clarity. The pallet plays no part in the invention and is therefore shown in phantom outline in the drawing. The front bracket 25 is shown in greater detail in FIG. 4.

The front bracket 25 includes a main mounting member 30 which is an angle iron that contains a first leg 31 and a second leg 32 that are joined together at a right angle corner 33. A pair of hubs 35 and 36 are mounted upon leg 31 of the main member 30 as for example by welding. Each hub includes a pair of side plates 37 and 38 between which a pair of wheels 39-39 are rotatably supported by means for pinions 40-40 that are mounted in the side plates.

Referring once again to FIG. 1, as is typical in the art, the truck unit is generally equipped with an overhead safety guard unit, generally reference 45 that is affixed to the lifting rails and which extends back from the rails over the cab to protect the operator from falling objects or the like. In this particular embodiment the safety guard serves as a connector for affixing the front bracket 25 to the rails. The bracket is secured to the safety guard by means of bolts 43-43 (FIG. 4) that pass through holes 44-44 provided in leg 30 of the angle iron and as threaded into a suitable cross member 45 in the safety guard. In the event the fork lift unit is not equipped with an overhead safety guard, the front bracket may be similarly bolted to a frame 47 that is affixed as by welding to the lifting rails as illustrated in FIG. 2.

When the front bracket is affixed to the rails as explained above, the main member 30 is generally perpendicular to the rails and wheel sets are generally aligned parallel to the rails.

The rear bracket 27 has a construction that is similar to that of the front bracket and includes a main member 50 which is an angle iron having a first leg 51 and a second leg 52 that are joined at a right angle corner 53. A pair of spaced apart support elements 55-55 are mounted inside the main member 50 and affixed thereto as by welding. The support elements in the embodiment are also angle irons. The length of each element is slightly longer than that of the second leg 52 of the main member.

Figure 4:
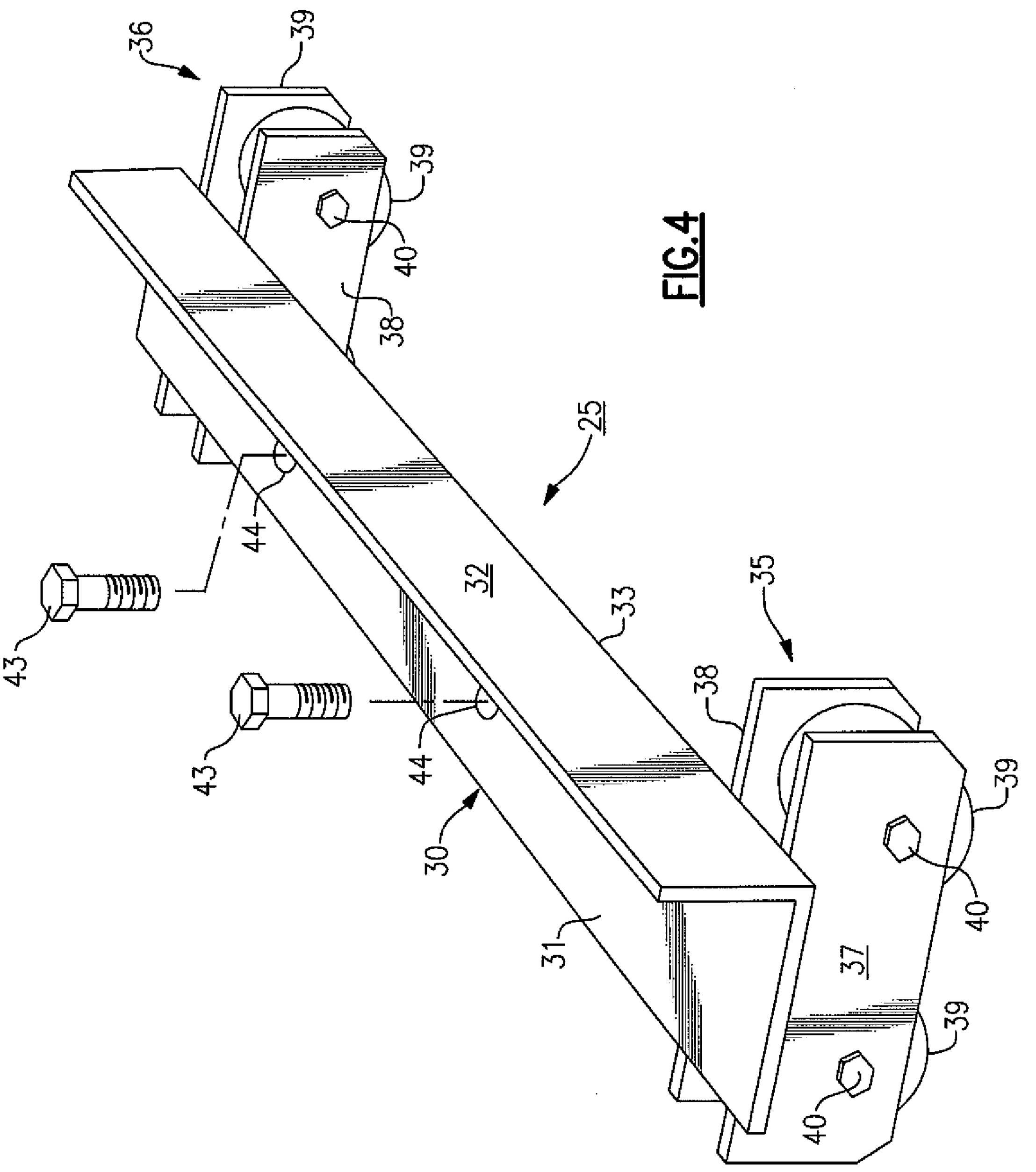
FIG. 4 is an enlarged perspective view of a wheeled bracket that is a component part of the system.
Figure 5:
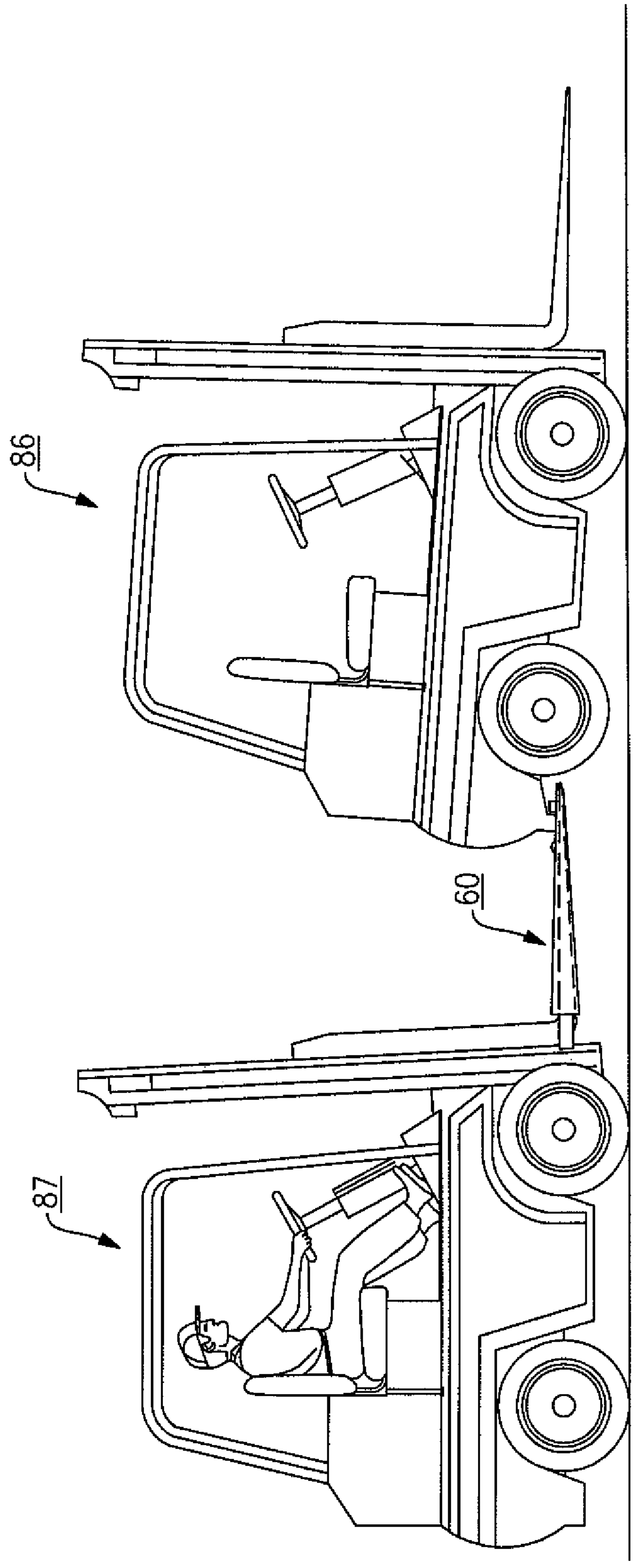
FIG. 5 is a side elevation illustrating a dolly in engagement with a fork lift truck using the hitch adaptor mechanism of the invention.

Bolt receiving holes 57-57 are provided in the first leg 51 of the main bracket element and bolts, similar to the bolts 43-43 shown in FIG. 4, are passed through the holes and threaded in the back of the cab to secure the rear bracket to the cab (see FIG. 1). The bracket is mounted on the cab so that the support elements 55-55 are able to rest upon the surface that supports the fork lift unit when the fork is turned over on its back as illustrated in FIG. 2. The second leg of the rear bracket extends downward from the cab when the unit is turned on its back and provided a lip. As will be explained in greater detail below, the lip can be engaged by an adaptor or any other suitable device needed to couple the rear bracket to a dolly. The term “dolly” as herein used can be any device that is capable of engaging a load and maneuvering the load. The term is broad enough to include but not limited to fork lift trucks, as for example truck 88 shown in FIG. 2.

As should be now evident, when the fork lift unit is laid over on its back, the two brackets will support the entire weight of the unit. Lifting the rear bracket, for example by use of a dolly, allows the fork lift unit to be easily moved from place to place as well as maneuvered into and out of tight places.

Figures 6, 7, 8, 9:
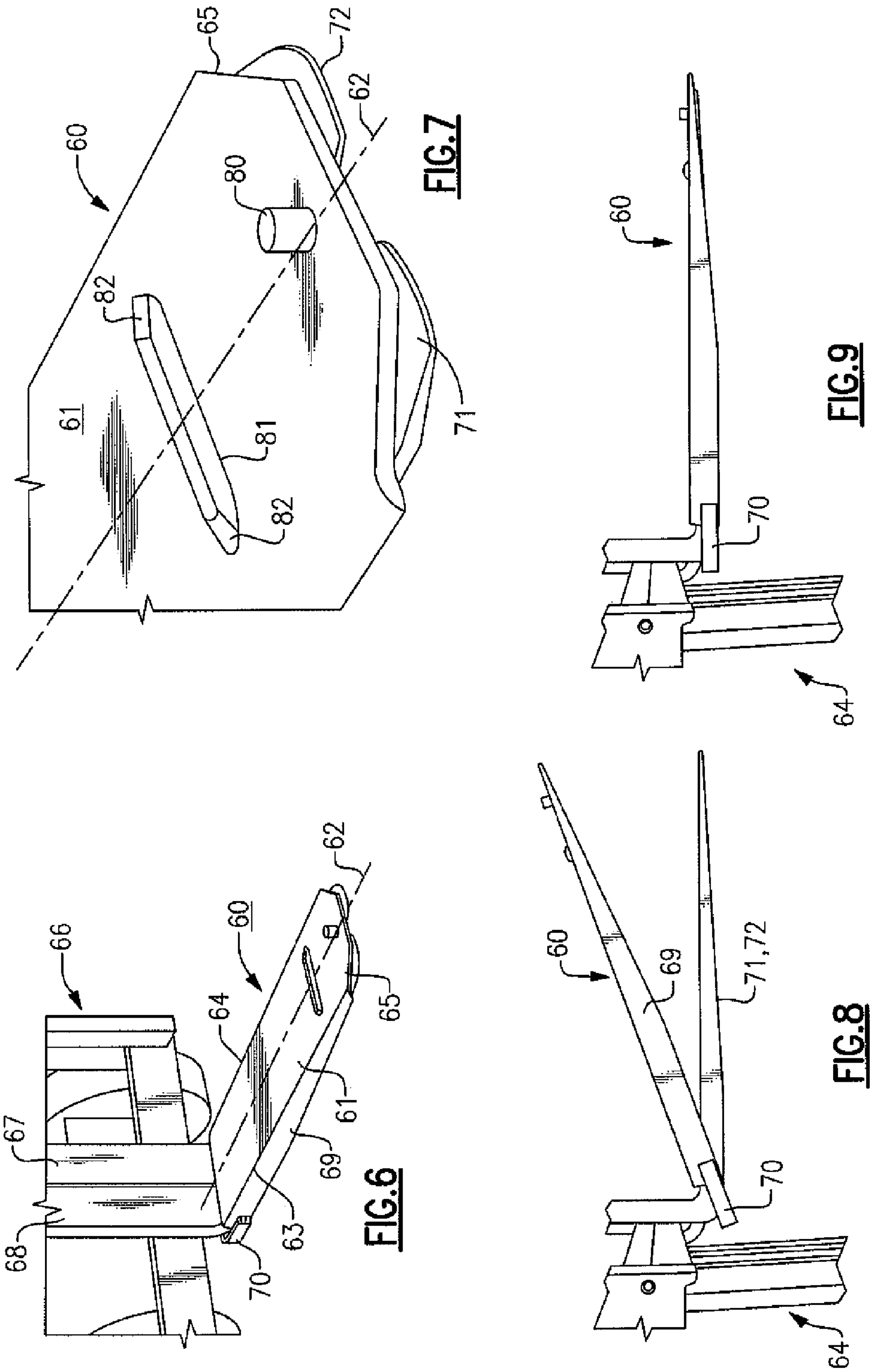
FIG. 6 is a partial perspective view of the adaptor mechanism mounted upon a fork lift.
FIG. 7 is an enlarged partial view in perspective showing the front end of the adaptor mechanism.
FIG. 8 is a partial side elevation of the adaptor mechanism illustrating the mechanism partially mounted upon a pair of forks.
FIG. 9 is a partial side elevation of the adaptor mechanism illustrating the mechanism in a down and locked position upon the forks.

Turning now to FIGS. 5-9 there is illustrated an adaptor generally referenced 60, that is ideally suited for connecting the rear bracket to a dolly which is capable of lifting the rear unwheeled bracket from a support surface and moving the fork lift unit by means of the wheeled front bracket. As best shown in FIG. 6, the adaptor 60 includes a flat elongated platform 61 that is symmetrical about an axial center line 62. The platform has two side edges 63 and that are in parallel alignment with the centerline and which are canted inwardly at the front of the platform to establish a pointed nose section 65. The platform has a width that is slightly greater than twice the width of an average fork. As pointed out above, the forks of most lift units are typically adjustably mounted upon a frame, such as frame 66 shown in FIG. 6, so that the fork can be centered upon the frame in a contiguous relationship. The bottom surface of the platform can thus be rested upon the two contiguous forks as shown in FIG. 6 with a slight overhang on each side of the platform. The length of the platform also allows for some overhang of the nose section when the rear edge of the platform is abutted against the vertical legs 67 and 68 of the two forks.

Side walls 69-69 are secured to the platform along at least a portion of the two side edges so that the side walls hang down over the extended arms of the vertical legs 71 and 72 of the forks and thus prevents the platform from becoming canted when seated upon the forks. As illustrated in FIGS. 8 and 9, the ends of a metal strap 70 are welded to the rear side edges of the platform to form a loop around the rear of the platform. The loop is sized so that it will fit snuggly around the vertical legs of the two forks. To attach the adaptor to the forks the loop is simply passed over the two horizontal legs of the forks and the adaptor moved back to a position as shown in FIG. 8 wherein the loop can be passed around the vertical legs of the forks. The adaptor can then be rotated downwardly to place the platform in resting contact with the horizontal legs of the two forks to lock the adaptor in place (see FIG. 9).

A hitch assembly is mounted upon the top surface of the adaptor platform that is arranged to engage the first leg 51 of the rear bracket 50 or any similar downwardly projecting member found on the back of a fork lift unit. The hitch assembly is comprised of a raised pin 80 that is centered upon the centerline 62 of the platform at the front of the nose section 65. A linear shallow wall 81 is stationed behind the pin and to allow the first leg of the rear bracket or any similar member to pass therebetween. The wall 81 runs perpendicular to the axial centerline of the adaptor and the ends of the wall are inclined toward one another to establish inclined ramps 82-82 that lead upwardly to the top surface of the wall. The latching mechanism may be capable of capturing a downwardly dependent edge of a cab body, as for example that of a small disabled truck 86 shown in FIG. 5 and used to lift the rear wheels of the truck off the floor or ground upon which the truck is resting. Accordingly, the entire weight of the truck will be transferred to the front wheels and the disabled vehicle thus easily steered by the second truck 87 that serves as a dolly. FIG. 2 shows a similar arrangement where a second truck 88, acting as a dolly, has hitched onto a first fork lift unit equipped with front and rear support bracket which has been laid back ready for shipment.

As can be seen, capturing one leg of the rear bracket or a cab member having a similar lid between the pin and the shallow wall of the adaptor enables a dolly or truck operator to move the load in either a forward or backward direction while at the same time steering the load in either direction. The ramps to the shallow wall allow the captured member to move up the wall during tight turns without adversely effecting the load balance.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A shipping and handling system for a motorized fork lift truck including a front, a back and an operator's compartment and lifting rails having a front and a back, the lifting rails connected to the front of the fork lift truck and extending upwardly beyond a top of the operator's compartment, wherein said system includes:

a first bracket that is connected to the back of said lifting rails and spaced from said operator's compartment;

a second bracket, separate from said first bracket, said second bracket directly connected to the back of said fork lift truck;

a set of wheels mounted upon one of said brackets and an unwheeled support element mounted upon said other bracket so that said fork lift truck can be turned over onto its back and rested upon a surface when said wheels and said unwheeled support element contact said surface, thereby said brackets supporting said truck on said surface; and said first and second brackets are removably attached to said truck such that said first and second brackets are removed from said truck after shipment, and prior to operation, of said truck.

2. The system of claim 1 wherein said set of wheels includes a pair of spaced apart wheel units each of which contains a pair of wheels that are in parallel alignment with said rails.

3. The system of claim 2 wherein said support element is a pair of spaced apart angle irons.

4. The system of claim 1 wherein said fork lift truck includes a truck frame mounted upon a set of wheels enabling said truck to move about a work place.

5. The system of claim 4 wherein said fork lift truck is motorized to drive the set of wheels of said truck frame.

6. The system of claim 1 wherein said brackets are fabricated of metal.

7. The system of claim 1 that further includes an adaptor for coupling said bracket having said unwheeled support element mounted thereon to a dolly.

8. A shipping and handling system for a fork lift truck that contains a cab and a pair of lifting arms that extend upwardly over a top of said cab, wherein said system includes:

a first bracket that is removably secured to the back of said lifting rails above the top of said cab and which contains a pair of spaced apart wheel units;

a second bracket that is removably secured to the rear of said cab which contains a pair of spaced apart unwheeled support elements;

said brackets being aligned so that said wheels and said unwheeled support elements support the entire weight of said truck when said truck is turned upon its back;

said brackets removed from said truck when said truck is placed in an upright and in preparation of operation of said truck; and an hitch mechanism for connecting the second bracket to a dolly so that the dolly can lift said second bracket off a supporting surface and maneuvering said truck upon said wheel units.

9. The system of claim 8 wherein said brackets are fabricated of metal.

10. The system of claim 9 wherein said brackets are angle irons each having legs joined at a right angle corner.

11. The system of claim 10 wherein said hitch mechanism contains a latch for engaging the second bracket.

12. The system of claim 8 wherein said first bracket is connected to the back of said rails by a protective shield that overhangs said cab.

13. A system for shipping a forklift having lifting rails and a cab, said system comprising:

a first bracket, said first bracket removably connected to said lifting rails;

a second bracket, said second bracket separate and spaced from said first bracket, said second bracket removably connected directly to a back of said forklift approximate said cab; and a set of wheels mounted on one of said brackets and an unwheeled support element mounted on said other bracket so that when said forklift is positioned such that said lifting rails extend in a substantially horizontal position, said wheels and said unwheeled support element contact a surface and said forklift rests upon said wheels and said unwheeled support element, and wherein said first and second brackets are removed from said forklift prior to operation of said forklift.

14. The system of claim 13 including said forklift having a front and a back and said lifting rails having a front and a back wherein the back of said lifting rails is located adjacent the front of said forklift; and said first bracket is removably connected to the back of said lifting rails.

15. The system of claim 14 wherein said first bracket is removably connected directly to the back of said lifting rails.

16. The system of claim 13 wherein said set of wheels includes a pair of spaced apart wheel units each of which contains a pair of wheels that are in parallel alignment with a respective rail, wherein said wheels rotate about axes that extend in a direction perpendicular to a longitudinal axis of said rail.

17. A method for transporting a fork lift truck between a first location and a second location, said fork lift truck having lifting rails and a cab, said method comprising:

removably attaching a first bracket to a back side of said lifting rails;

removably attaching a second bracket, said second bracket spaced and separate from said first bracket, to said cab;

mounting a set of wheels on one of said brackets;

mounting a support element on the other of said brackets;

positioning said fork lift truck such that said lifting rails lie in a substantially horizontal position so that said fork lift truck rests upon said wheels and said support element, whereby said fork lift truck can be loaded in a transportation vehicle for shipment from the first location to the second location; and positioning said fork lift truck in an upright position at said second location wherein said lifting rails extend substantially vertical and then removing said first bracket and said second bracket from said fork lift truck prior to operation of said fork lift truck.

18. The method of claim 17, said method further including the step of returning the first bracket and second bracket to said first location after transportation of said fork lift truck.

* * * * *